United States Patent [19]

Gruen et al.

[11] Patent Number: 4,633,084
[45] Date of Patent: Dec. 30, 1986

[54] HIGH EFFICIENCY DIRECT DETECTION OF IONS FROM RESONANCE IONIZATION OF SPUTTERED ATOMS

[75] Inventors: Dieter M. Gruen, Downers Grove; Michael J. Pellin, Oak Brook; Charles E. Young, Westmont, all of Ill.

[73] Assignee: The United States of America as represented by the United States Department of Energy, Washington, D.C.

[21] Appl. No.: 691,825

[22] Filed: Jan. 16, 1985

[51] Int. Cl.⁴ ............................................. G01N 23/00
[52] U.S. Cl. .................................. 250/306; 250/307; 250/309; 250/423 P
[58] Field of Search ............... 250/309, 281, 282, 283, 250/288, 287, 423 P, 307, 306

[56] References Cited

U.S. PATENT DOCUMENTS

| | | |
|---|---|---|
| 3,619,606 | 11/1971 | Shriner . |
| 3,660,655 | 5/1972 | Wardell . |
| 3,668,383 | 10/1972 | Carroll . |
| 3,920,990 | 11/1975 | Van Nieuwiand et al. ......... 250/309 |
| 3,987,302 | 10/1976 | Hurst et al. ......................... 250/283 |
| 4,132,892 | 1/1979 | Wittmaack .......................... 250/309 |
| 4,330,208 | 5/1982 | Eloy .................................... 250/288 |
| 4,442,354 | 4/1984 | Hurst et al. ........................ 250/281 |
| 4,447,724 | 5/1985 | Oechsner ............................ 250/281 |

OTHER PUBLICATIONS

"New Wide Angle, High Transmission Energy Analyzer for Secondary Ion Mass Spectrometry", by M. W. Siegel and M. J. Vasile, Rev. Sci. Instrum. 52(111), Nov. 1981, pp. 1603–1615.

"Sputter Initiated Resonance Ionization Spectroscopy", by J. E. Parks et al., Thin Solid Films, 1983, North-Holland Publishing Co., pp. 69–78.

"SARISA—For Those Difficult to Detect Sputtered Atoms", by D. M. Gruen et al., Vacuum Technology, Research & Development, Mar. 1984, pp. 153–160.

"Trace Surface Analysis With Pico-Coulomb Ion Fluences: Direct Detection of Multiphoton Ionized Iron Atoms From Iron-Doped Silicon Targets", by M. J. Pellin et al., Surface Science 144 (1984), pp. 619–637.

Primary Examiner—Bruce C. Anderson
Attorney, Agent, or Firm—William Lohff; Michael J. Higgins; Judson R. Hightower

[57] ABSTRACT

A method and apparatus are provided for trace and other quantitative analysis with high efficiency of a component in a sample, with the analysis involving the removal by ion or other bombardment of a small quantity of ion and neutral atom groups from the sample, the conversion of selected neutral atom groups to photoions by laser initiated resonance ionization spectroscopy, the selective deflection of the photoions for separation from original ion group emanating from the sample, and the detection of the photoions as a measure of the quantity of the component. In some embodiments, the original ion group is accelerated prior to the RIS step for separation purposes. Noise and other interference are reduced by shielding the detector from primary and secondary ions and deflecting the photoions sufficiently to avoid the primary and secondary ions.

24 Claims, 3 Drawing Figures

HIGH EFFICIENCY DIRECT DETECTION OF IONS FROM RESONANCE IONIZATION OF SPUTTERED ATOMS

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

BACKGROUND OF THE INVENTION

This invention relates to a sensitive method of quantitative analysis and more particularly to the analysis of the surface composition of samples containing trace amounts of one or more components by a highly efficient, direct detection of multiphoton ionized atoms representing the component or components of interest. In some embodiments, it is capable of detecting a component at levels in the range of parts per billion (ppb) and may require a sample as small as one atomic monolayer or less.

Recent trends in product specification, exemplified by stringent requirements in semiconductor processing, illustrate the importance of quantitative surface analysis of impurities at progressively lower impurity levels. In general, the development of instruments and other apparatus useful for this purpose has progressed through secondary ion mass spectroscopy (SIMS) and laser fluorescence spectroscopy (LFS) to multiphoton resonance ionization spectroscopy (RIS). In each instance, portions of a sample are removed by sputtering with an ion beam to produce secondary ions and neutral atoms in addition to backscattered primary ions. One of the limitations of the SIMS apparatus is that the detection usually involves only a small fraction of the sputtered flux leaving the surface in an ionized state and does not sample directly the major portion of the flux consisting primarily of neutral atoms. This limited detection plus the use of a mass spectrometer results in the need for a significant quantity of sputtered flux to be generated for the desired detection. With LFS, neutral atoms are laser excited and their fluorescence detected. The laser is tuned so that its frequency matches that of a transition of the sputtered atom. However, LFS in general has the disadvantage of low detection efficiencies such that only about $10^{-2}$–$10^{-4}$ photons per fluorescent photon arrive at the detector.

The development of RIS has provided an improvement in the detection methods associated with SIMS and LFS. In RIS, multiphoton ionization of neutral atoms provides a source of ionized neutrals for detection. Further details of an RIS apparatus are set forth in U.S. Pat. No. 4,442,354 which is hereby incorporated herein by reference. While RIS provides a detection method with extreme sensitivity, improvement in the collection efficiency of its ion detection system and reduction in background noise would increase its value for quantitative analysis. In particular, the desired ion detection system would provide improved discrimination between the signal due to multiphoton ionization of sputtered neutral atoms and noise sources primarily due to backscattered primary ions (charged or neutralized) and secondary ions produced in the sputtering process.

Accordingly, one object of the invention is the detection method based on RIS with improved efficiency. A second object of the invention is a detection method having reduced background noise. A third object of the invention is a detection method which does not require mass spectroscopy. Another object of the invention is a sensitive detection method capable of detection in the ppb to ppt range. Yet another object of the invention is detection method requiring a sample containing only a few atoms. These and other objects of the invention will become apparent from the following detailed description.

SUMMARY OF THE INVENTION

Briefly, the invention is directed to a method and apparatus for the quantitative analysis of a component in a sample. The method includes the steps of bombarding the sample with a beam of energetic particles or photons sufficient to produce a respective sequence of ion and neutral atom groups emanating in a direction from the sample, directing one or more laser energy pulses at the neutral atom group to convert the neutral atoms to ions by laser initiated resonance ionization spectroscopy, causing the ionized neutral atoms to be selectively deflected with respect to the emanating ion group to form a deflected beam of ionized neutral atoms, and detecting the ionized neutral atoms in the deflected beam as a measure of the quantity of the component of interest in the sample.

Preferably, the original ions emanating from the sample are accelerated for further separation from the neutral atoms by a biasing technique prior to the photoionization step. In addition, the deflection is carried out with a wide band energy filter to accomplish the selection of ions having a relatively wide band of energies. Preferably, the deflection is sufficient to essentially reverse the direction of the original beam and thereby reduce interference of other particles emanating from the sample. Further, the detector is isolated from interference by backscattered primary ions and secondary ions and oriented to receive the deflected beam of ionized neutrals. Another step of importance is the use of an initial laser pulse to ionize and remove other neutrals which represent other components of the sample and could cause interference in the desired detection.

The invention has a number of advantages. Background noise is reduced by avoiding the deflection or detection of other ions emanating from the sample. With reduced background noise, extreme sensitivity may be achieved so that only a small number of atoms are removed for analysis.

DETAILED DESCRIPTION OF THE PREFERRED EMBODIMENT

Figure 1:
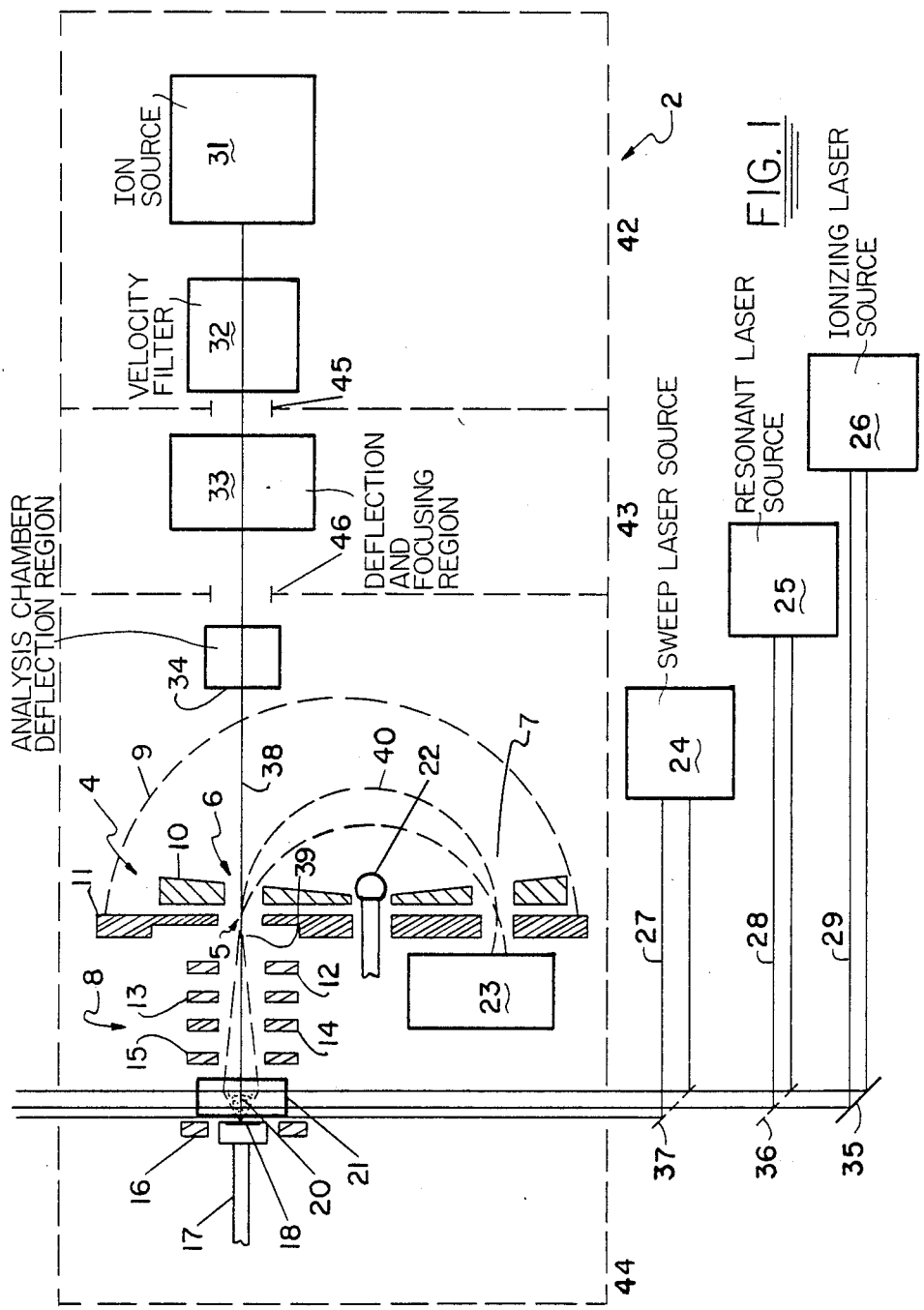
FIG. 1 is a general schematic of one embodiment of the invention.

Typically, during sputtering of metallic and semiconductor surfaces, a variety of particles emanate from the sample surface at a variety of angles within a 180 degree range. These include a beam of secondary ions and neutrals and when an ion beam causes the sputtering, primary ions also leave the surface by backscattering at a variety of angles. For the desired detection method to operate efficiently, it is necessary to remove the primary and secondary ions from the beam of neutrals before photo-ionization and detection. In addition, the neutral atoms may include both the component of interest and one or more other neutrals which can interfere with the desired detection. With samples of silicon and iron, these neutrals often include $Si_2$ particles together with Fe atoms which have a similar mass. When the desired analysis is directed to Fe as the component, the presence of the various other particles such as $Si_2$ can cause significant interference and noise which can adversely affect the accurate detection of a component at a level in the range of ppm. In some instances, these neutrals represent the other components at elevated energy levels and may be easily photo-ionized.

In the sputtering process, conventional energy beams have included energetic particles produced from various ion sources. However, an energy beam of photons from a laser source may also be utilized.

In this invention, the adverse effects of the primary and secondary ions are effectively minimized by a selective deflection of the photo-ionized neutrals apart from the primary and secondary ions, a further selection of the photo-ionized neutrals of interest in the deflected beam, and a subsequent detection of the photo-ionized neutrals of interest wherein access to the detector is isolated from any primary and secondary ions leaving the sample surface separately from the beam.

The invention further provides an ultrasensitive, selective analysis of samples where only a very small number of atoms are required. One use of the invention is in trace surface analysis where the concentration of a a particular surface component can be measured with a theoretical sensitivity below 1 ppb and a demonstrated sensitivity of below 100 ppb. This analysis may be accomplished with removal of less than one monolayer of sample and the measured fraction is derived in large measure from the topmost (surface) atomic layer of the sample. Trace surface analysis has two stringent requirements which may be met by this invention. First since there may be very few atoms available for measurement, the analysis should be extremely efficient in sample utilization. For the component of interest this can be quantified in terms of the atoms detected/atoms removed as the figure of merit. In this invention, the theoretical efficiency may reach and exceed 20%. The second requirement is that all noise sources be substantially eliminated from the signal with a minimum loss of signal. Any spurious noise source can drastically reduce the sensitivity of the apparatus.

Accordingly, the inventive method may be characterized by the steps of bombarding the sample with an energy beam sufficient to produce a respective sequence of ion and neutral atom groups emanating in a direction from the sample, directing a laser energy pulse at the neutral atom group to convert the neutral atoms to ions by laser initiated resonance ionization spectroscopy, causing the ionized neutral atoms to be selectively deflected with respect to the emanating ion groups to form a deflected beam of ionized neutral atoms, and detecting the ionized neutral atoms in the deflected beam as a measure of the quantity of the component of interest in the sample. Preferably, the original ions emanating from the sample are accelerated for further separation from the neutral atoms by a biasing technique prior to the photoionization step. In addition, the deflection is carried out with a wide band energy filter to accomplish the selection of ions having a relatively wide band of energies. Further, the detector is isolated from interference by backscattered primary ions and secondary ions and oriented to receive the deflected beam of ionized neutrals. Another step of importance is the use of an initial laser pulse to ionize and remove other neutrals which represent other components of the sample and could cause interference in the desired detection.

Initially in the invention, an energetic beam of energetic particles and particularly ions is directed against a sample as shown in FIG. 1. This primary ion pulse typically has an energy in the range of 100 eV to 10 keV. The primary ions strike the sample, sputtering the surface to produce a stream of neutral and ionic sample components.

In the sputtering process, major sources of noise are created which must be eliminated before the detection step. With ion induced sputtering, the three sources of noise are backscattered primary ions (charged or neutralized), secondary ions of other sample constituents, and photoions of other sample constituents produced inadvertently in the RIS step. With energetic photons as the sputtering source, the latter two are the noise sources.

Following formation of the stream of secondary ions and neutral atoms, separation of secondary ions from the neutrals is preferably accomplished prior to the resonant ionization step. This is accomplished without affecting the component of interest by adding a substantial component of momentum to the secondary ions by means of pulsed electrical fields. This can be applied in either of two ways. A positive bias can be applied to the sample 18 in the time interval of interest. This increases the secondary ion energy substantially to a level so that the deflector is rendered incapable of deflecting the secondary ions to the detector thereby reducing the background noise substantially. Transverse momentum can be added by electrical pulsing of the deflection plates 21. Again the apertures prevent the secondary ions from arriving at the detector. The result is that momentum or energy are added to the secondary ions to effectively remove them as a noise source. This need arises from the long high energy tail in the energy distribution of secondary ions sputtered from the target 18.

Elimination of noise due to nonresonant ions may be accomplished by one or more methods. This noise source arises from other constituent atoms than those of interest being removed from the target by the sputtering process in excited, metastable electronic states which may be easily ionized during the photo-ionization step. While normally considered to be a small component of the total sputtered flux, these electronically excited atoms can represent a major noise source for sensitive analysis. One method of removal involves the use of laser 24. Its photon beam 27 is directed close to the sample and before the resonant 25 and ionizing laser 26 pulses 28 and 29, respectively. In this manner, the candidates for nonresonant photoionization are produced before the signal (RIS) ions and can be swept from the extraction volume 20 in a manner analogous to the secondary ions.

A second method for reducing the nonresonant photoions is to choose a RIS ionization scheme which utilizes a long wavelength ionizing beam 29. In this method, the resonantly excited level of the atomic species to be analyzed is chosen to be at high energy, close to the ionization continuum. The probability of having produced excited atoms directly in the sputtering process decreases exponentially with the excitation energy required. Since a low energy (long wavelength) photon is sufficient to complete the RIS process, many such photons would be required to produce nonresonant multiphoton ionization (MPI) from low lying states, produced in sputtering. Thus, high power can be used in the ionizing beam 29, while nonresonant MPI noise is kept at a negligible level.

A further feature of the invention is its use of a pulsed lens system 8 to reduce both noise and sample memory effects. As illustrated, this lens is set to a voltage appropriate for focusing the incoming primary ion pulse. It remains at high voltage to reject noise sources. Its voltage is then changed to allow focusing of the RIS signal ions onto the RDD entrance. Thus it provides a window which opens only to allow signal. It allows the sample to be used perpendicular to the ion beam axis with many attendant advantages. Its proximity to the sample allows excellent focusing properties. Further, since the surfaces which may have had deposition from previous samples are shadowed from the primary ion beam, sample memory effects are reduced.

Figure 2:
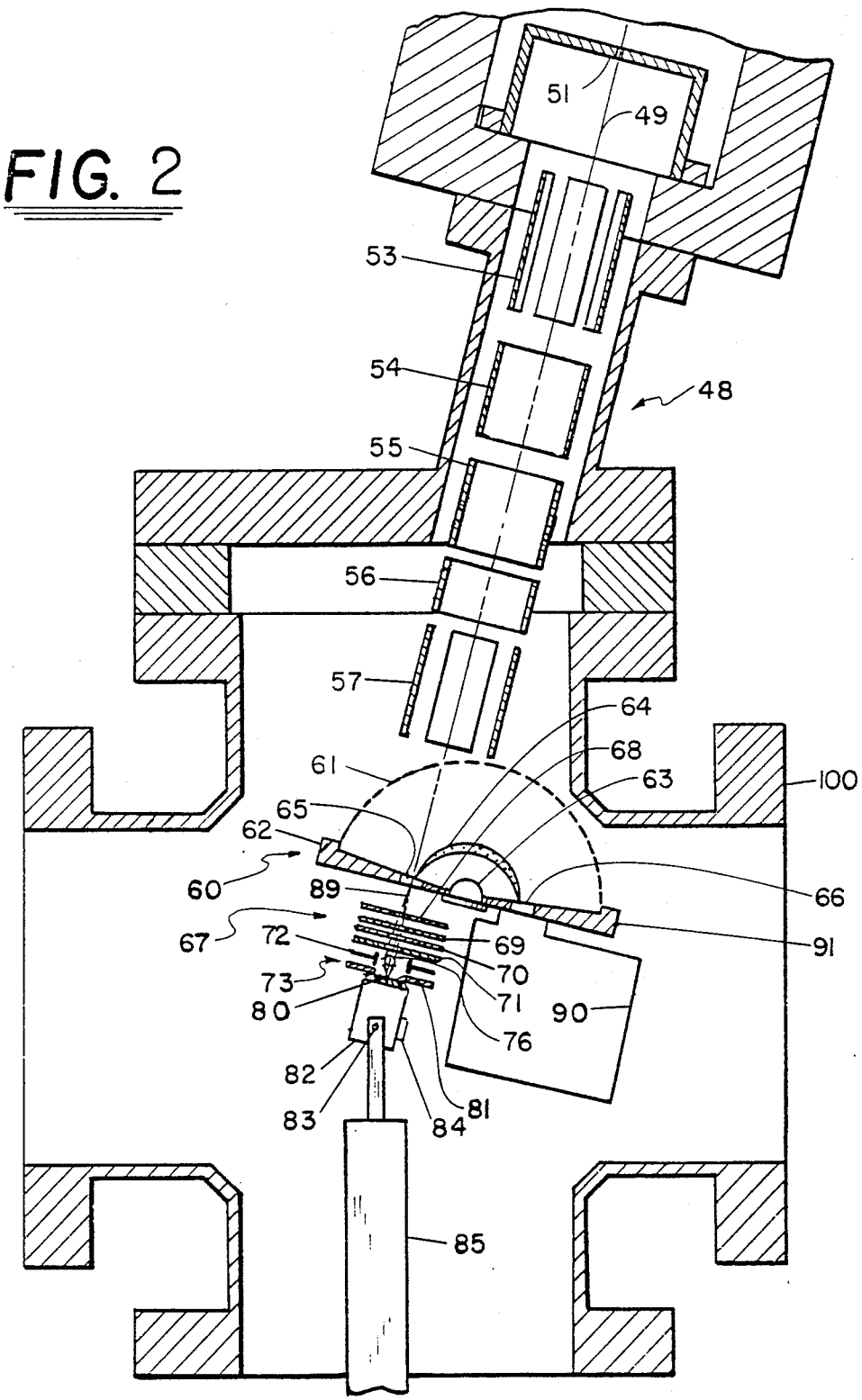
FIG. 2 is a schematic of similar embodiment to that of FIG. 1 with further details.
Figure 3:
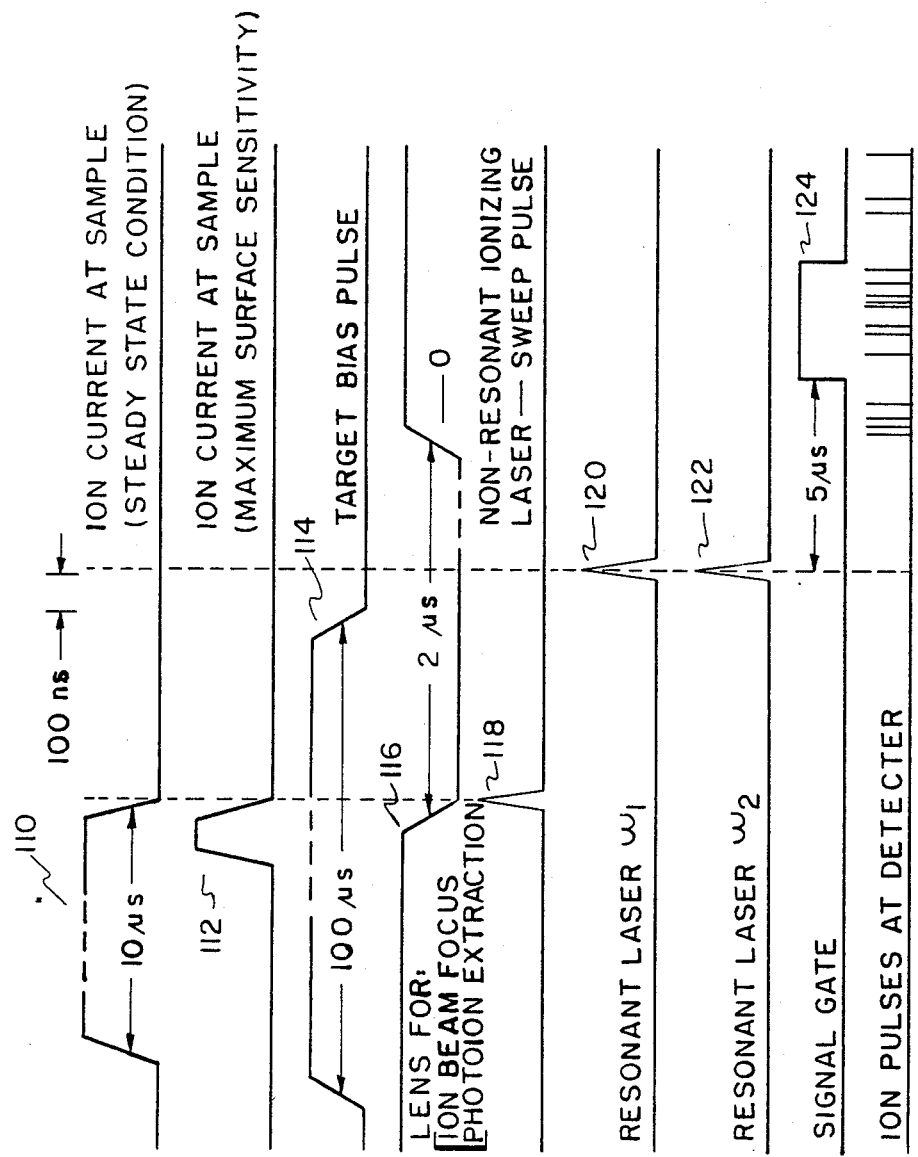
FIG. 3 is a representation of the relative timing of certain events associated with the invention.

Apparatus for one embodiment of the invention is shown in a block diagram representation in FIG. 1. FIG. 2 is an approximately scaled diagram of the analysis chamber essentially similar to chamber 44 of FIG. 1 and components contained therein. FIG. 3 provides the timed sequence of operations and signals produced in experiments in which samples are analyzed.

Apparatus 2 illustrated in FIG. 1 includes a plurality of chambers 42, 43 and 44 where an ion beam 38 is generated by ion source 31 and directed to sample 18. Chambers 42-44 are isolated except for apertures 45 and 46 to reduce effects from ion source 31 and to improve the vacuum in chamber 44. As illustrated, means including ion source 31 are provided for bombarding sample 18 with energetic beam 38. Laser sources 24, 25 and 26 provide beams 27, 28 and 29 which are respectively deflected by elements 37, 36 and 35 towards zone or collecting volume 20. A sweeping action is provided by laser 24 to reduce interference by neutrals of other components which may interfere in the detection of the photoionized beam 39. As illustrated, lasers 25 and 26, beams 28 and 29, and elements 36 and 35 are included within the means for directing one or more laser energy pulses at the neutral atom groups for photoionization.

In chamber 42, ions produced in ion source 31 are passed through velocity filter 32 which employs crossed magnetic and electric fields. Typically inert gas (Ar, Xe) is used in source 31, producing beams of the corresponding singly charged ion (Ar+, Xe+, respectively). The function of the velocity filter 32 is to remove from the beam all ionic species except for the principal beam component, e.g., Ar+. Of special importance is the removal of ions of any element contained in the target 18 and for which trace analysis is to be performed. Typically, a continuous current of 5 μA of Ar+ ions only is delivered at an energy of 5 keV through the first collimating aperture 45. Region 33 contains deflection plates and an electrostatic lens system to direct beam 38 between aperture 45 to aperture 46, the entrance to analysis chamber 44. The deflection plates in region 33 can be pulsed in order to convert the continuous beam of ions entering chamber 43 into a low duty cycle, pulsed beam for use in the analysis chamber 44. Preferably, the beam line is arranged so that there is no direct line of sight from source 31 to sample 18. This feature prevents the erosion of the sample by energetic neutral atoms produced by charge exchange processes in chamber 42. Slight deflection by plates in region 33 allows the ion beam 38 to pass into chamber 44, at a direction perpendicular to sample 18.

Analysis chamber 44 includes beam deflector 4, lens system 8, deflection plate system 21 and detector 23. Analysis chamber 44 also includes deflection plate system 34 to permit rastering of the ion beam over an extended region of the sample 18. The rastering procedure is advantageous for eroding a region of the sample uniformly in depth profile operations. For sample erosion, the ion beam 38 from source 31 is allowed to pass continuously through region 33 and onto sample 18 for a fixed time interval as further explained with regard to FIG. 3.

Chamber 44 is maintained under ultrahigh vacuum conditions ($\sim 10^{-10}$ Torr) by a large (200 L/s) ion pump and titanium sublimator. Differential pumping is provided in upstream chambers 42 and 43 with high impedance between chambers provided by apertures 45 and 46 of mm scale dimensions. The ultrahigh vacuum conditions prevent contamination of the target by ambient gases over a time of several hours. Lens system 8 includes elements 11-15 for the focusing of charged particles directed at sample 18. During the time that high energy charged particles from source 31 are in this lens system, elements 12 and 14 are held at high positive voltage (e.g., 2 kV) in order to produce a beam focused at a small spot on sample 18.

As illustrated, means are provided for deflecting the ionized neutral atoms for the component of interest, the means including deflector 4 with resistive disk 10, hemispherical screen 9, and metal ball 22 to form a resistive disk deflector (RDD). Disk 10 and plate 11 are normally symmetrical although are illustrated with the left sections enlarged to show further details. Voltages applied to these elements create a deflection region for collecting of product ions for the desired analysis. The RDD produces negligible deflection of the incoming primary ion beam from source 31.

In order to minimize the amount of material removed from the sample, ion beam 38 is pulsed in synchronism with the pulsed laser system 24-26. FIG. 3 represents the time sequence for a single cycle of the detection scheme. Prior to the firing of the lasers, the ion beam is allowed to impact the sample 18 for a short time, determined by deflection plates in region 33. During the time that the sample is bombarded, secondary ions and neutral atoms are being continuously released. The kinetic energy spectrum of both ions and neutrals released peaks at a few eV but has nonnegligible population out to beyond 100 eV, the average energy for ions being somewhat higher for ions than for neutrals. Means are provided for accelerating the ions emanating from the sample to separate those ions from the neutral atom group. During the primary ion pulse, the sample holder 17 and sample 18 are given an additional positive potential, shown as target pulse 114 on FIG. 3, so that even the slowest secondary ions emitted from the target will have kinetic energies in excess of the transmission bandpass of the RDD upon arrival at its entrance orifice 5 in baseplate 11. Any secondary ions reaching the RDD will enter orbits causing them to escape through screen 9. They are thus not detected by the multiplier detector 23. During the time that the primary ion pulse is in the lens system 8, elements 12 and 14 are maintained at kV potentials to focus the primary beam 38 at the sample. This forms an additional barrier to secondary ions produced at the sample. Also, transverse deflection plates 21 can be pulsed on during the primary ion pulse in order to remove secondary ions by giving them enough transverse energy to avoid capture by the RDD. These methods have been found more effective in suppressing secondary ions at the sample 18 compared to biasing it to negative potential.

After a primary ion pulse of a few μsec at the sample, a steady state concentration of neutral sputtered atoms from the sample is reached in the collection volume 20. Then the primary ion pulse is abruptly terminated. At about the same time, elements 12 and 14 of the lens system return to slightly negative potential to allow extraction and focusing of photoions. Just prior to the firing of the lasers, sample 18 returns to the potential of the adjacent backplate 16 at 100–200 volts positive relative to ground. Elements 11, 13, and 15 remain unchanged, near ground. This condition provides a potential drop of ~100 V between the photoion collection volume 20 and the entrance plate 15 to the lens system 8.

In the resonance ionization step, one or more lasers 24–26 are fired simultaneously to provide selective excitation followed by ionization of the atomic component of interest. Wavelengths of the lasers are chosen to preclude one photon ionization of species other than that for which the resonant excitation is tuned, sputtered in low-lying electronic states. However, minute fractions of the sputtered material may occupy high-lying states, susceptible to 1-photon, nonresonant ionization. Ions from such processes constitute noise in this apparatus. One method for the removal of such noise is carried out via a "sweep" pulse of moderate power preceding the resonant laser pulse and of sufficient power to cause 1-photon ionization of high-lying states but not 2-photon nonresonant ionization of low-lying states. The laser beam for the sweep pulse should be spatially as close to the target as possible, as shown proceeding from laser 24.

Resonantly excited photoions of the desired species illustrated as beam 39 are transmitted through the lens system 8 and enter the resistive disk deflector RDD 4 formed by the spherical elements ball 22, mesh 9, and by the disk 10. The latter is fabricated from material (i.e., high purity silicon) of high resistivity with a cross section varying linearly with radius. A current is passed between electrodes on the inner and outer edges of disk 10. Elements 9, 10, and 22, when maintained at appropriate potentials, establish a region of electrostatic potential varying as 1/R, R being the radial coordinate, measured from the center of the ball.

Deflector 4 includes means for focusing of deflected beam 39. As illustrated, the potential region of deflector 4 produces ion orbits 40 which refocus in two dimensions at the entrance 7 leading through disk 10 and plate 11 to the ion detector 23, allowing for high geometric collection efficiency. The property of refocusing after 180 degrees of deflection of the ion orbits is characteristic of the 1/R potential. The energy passband is determined by the size of entrance and exit apertures 6 and 7 to the deflection region relative to the effective radius of the ion orbits. The energy passband for the RDD device of FIGS. 1 and 2 is 20% of the nominal kinetic energy E, e.g., $90 < E < 110$ eV for typical conditions of operation. This is adequate to transmit the range of photoion energies present because of the distribution in initial kinetic energies of sputtered neutrals.

It is evident that the RDD device 4 will not transmit back-reflected primary ions since these remain in the keV energy regime. Even more importantly, the detector 23 is shielded from back-reflected neutralized atoms from the primary beam 38. Such fast atoms can cause saturating signal at the detector 23, precluding sensitive measurements. The detecting means represented by detector 23 may be a conventional electron multiplier detector. In the present embodiment of the apparatus (FIG. 2), the detector consists of a pair of microchannel plates in tandem. This configuration combines high gain (up to $10^8$) with narrow output pulse width (~1), giving wide dynamic range in pulse-counting experiments. The combination efficient photoion collection, with rigorous noise suppression from all extraneous sources of charged particles, is an important feature of the invention.

FIG. 2 is a schematic diagram of apparatus illustrating preferred features of analysis chamber 44 of FIG. 1. As illustrated, ion beam 49 enters the differentially pumped chamber 100 through aperture 51. Chamber 100 is at ultra-high vacuum and reaches base pressure below $10^{-10}$ Torr, allowing runs of several hours with negligible target contamination.

Deflection plates 53 provide an initial deflection of beam 49 to select a specific image position on sample 80. Following deflection plates 53, beam 49 is refocused by cylindrical elements 54–56 which form an electrostatic lens system. This permits beam 49 to be directed at sample 80 at a 90 degree angle without adverse effects of image distortion and increased spatial extent, induced by operation with a focal plane oblique to the beam axis. In addition, plates 53 in combination with deflection plates 57 provide a means for precise controlled movement of beam 49 across a sample with sputtered material from each spot on the sample being analyzed. The resultant apparatus thereby includes means for sequentially moving the energy beam over a surface of the sample to sequentially provide a plurality of separate ion and neutral atom groups for analysis. It thereby would act as an ion microscope.

Plates 57 form an optional reflection system for maintaining improved focusing properties of ion beam 49 while rastering. Deflection plates 53 induce a spatial displacement of beam 49 from the central beam axis. Plates 57 redirect the ion beam onto the central axis in a manner such as to recross the central axis in the center of lens system 67. This minimizes off axis aberrations in the final focusing step. Beam 49 is directed through aperture 65 of deflector 60, lens system 70 to sample 80. The sputtering action on sample 80 fills collection volume 76. The beam 89 represents the stream of ions leaving volume 76. Deflector 60 includes mesh 61, disk 62 and ball 63 and is similar in construction to the deflector of FIG. 1. The deflected beam is represented by beam 64 and selectively enters aperture 66 of disk section 91 prior to detector 90.

Lens system 67 also is similar to the lens system 8 of FIG. 1 and includes lens elements 68–73. Sample 80 with surface 81 represents the target and is positioned on holder block 82 which is pivotably mounted in arm 83 of base 85.

The actual target manipulator system permits translation of base 85 along three mutually perpendicular axes as well as rotation of holder block 82 around pivot point 83. By this means, either sample 80 or Faraday cup 84 may be oriented to be the image point of ion beam 49. Faraday cup 84 allows measurement of ion beam current and by the scanning movement of bar 85, beam profiles. Reference materials in cup 84 also allows calibration of the analysis system.

As illustrated in FIG. 3, a timing sequence is provided for the apparatus of FIG. 1 to achieve a desired detection level, a high signal to noise ratio, and a high operating efficiency. The ion current 38 of FIG. 1 is maintained either for a steady state condition as illustrated by the extended pulse 110 or for maximum surface sensitivity as illustrated by the shorter pulse 112.

In the steady condition, the time of bombarding pulse 110 is sufficient for neutral atoms of slow velocity "$v_s$" to completely transverse the photoionization volume 20 (FIG. 1); $v_s$ represents a velocity below which only a negligible fraction of sputtered atoms is estimated to occur. Pulse 110 is then terminated to prevent unnecessary erosion of sample 18. Efficiencies (ion detected/atom of interest sputtered) are about 2-3% in this mode.

The second mode, for maximum surface sensitivity, and identified by pulse 112 is used to reduce the amount of sample required. In this mode, a very short ion pulse compared to the flight time of atoms from the surface of the sample 18 to volume 20 (typically about 500 ns) is employed. After a brief delay, the slower atoms have reached the edge of the volume 20 nearest sample 18 while the fast atoms have transversed the volume. Therefore, most of the sputtered atoms are available for photoionization. The efficiencies may be in the order of 20–30%. However, a lower signal strength results and longer counting times are usually required. While in some instances, the longer pulse may be preferred, the shorter pulse offers the opportunity of using a velocity-correlated refocusing by choosing the accelerating voltage ramp between plates 16 and 15 so as to compress the time of flight spectrum at detector 23.

The target is biased by positive pulse 114 which is in the order of 300 V so that any secondary ions, generated at the surface of sample 18, arrive in the deflection region of the RDD with escape velocities to pass through mesh 9 and avoid deflection and detection. By this technique, all ions emanating from the sample surface receive at least the energy of the target pulse voltage.

The target pulse bias is removed just prior to the firing of the laser photoionizing pulses 120 and 122, at which time the bias on plates 16 and sample 18 are made equal, providing a uniform extraction field for the photoionized neutrals.

The lens system 8 illustrated by lens plates 11–15 provides a number of advantages. The incoming beam 38 is thereby focused into a small spot on target 18 by placing the lens plates 11–15 very close (i.e., ~1 cm) and essentially perpendicular to sample 18. Lens system 8 also serves to focus photoions generated by laser pulses 120 and 122 onto the entrance ports 5 and 6 formed by disc 10 and plate 11. As illustrated for pulse 116, plates 12 and 14 of lens systems 8 are pulsed down from a potential in the kilovolt range to values near ground to achieve a high level of extraction of photoions from collection volume 20. Prior to the opening of signal gate 124, the voltage of plates 12 and 14 is returned to the kilovolt value to essentially block the collection of ions arriving later in time than the photoions of interest.

Prior to the generation of photoions from pulses 120 and 122, preionizing beam 27 is directed near the surface of sample 18 to provide pulse 118 immediately after the end of ion current pulses 110 or 112. The use of pulse 118 acts to sweep the collection region 20 clear of any excited states of the majority species from the substrate of sample 18 which may be capable of being 1-photon ionized from their existing high-lying levels. These excited states might otherwise appear along with the resonantly ionized species of interest, and in unfavorable cases where they had similar mass, could appear in the same time-of-flight region at detector 23. The excited-state species ionized by pulse 118 are removed in the same manner as other secondary ions generated from sample 18.

In the photoionization, the resonant laser 25 at frequency $\omega_1$ is tuned to excite atoms of the impurity or other species to be monitored from their ground state to an electronically excited state. Ionization is initiated by laser 26, essentially coincidently which is tuned to frequency $\omega_2$ and causes the impurity atoms to change from the level populated via the resonant laser 25 to the ionization level. As illustrated in FIG. 1, a laser pulse 28 from laser 25 is directed to deflector 36 and then to volume 20. Laser pulse 29 from laser 26 is directed to deflector 35 and then to volume 20.

As the beam 39 of photoions is deflected by disk 5, signal pulses from detector 23 are accepted for a limited time set by the duration of a signal gate pulse. This pulse 124 is illustrated in FIG. 3. Essentially, the time that the gate is open is matched to the width and position in time of the ions of interest. The resolution is somewhat coarse because of the range of orbits reaching detector 23 and by the interest in high collection efficiency.

Tests have been performed on high-purity silicon samples which have been implanted with Fe atom impurity in such a manner as to produce peak concentrations of ~50 ppm at a depth of ~50 nm into the sample. By depth profiling the sample, regions of much lower concentrations could be reached. Samples were placed in position 80 in the sample holder of FIG. 2. Reference materials on Faraday cup 84 used for calibration purposes were: (a) pure Fe, and (b) Mo with normal ~50 ppm Fe impurity.

Ion beam 49 of FIG. 2 was operated at 5 KeV energy and at currents corresponding to a DC level of a few microamperes (typically 3 $\mu$A). Mass selected beams of Ar$^+$ and Xe$^+$ were used. A focused spot of ~1 mm diameter at target position 80 was employed in these measurements. For RIS experiments, a pulse length of typically 4 $\mu$s was used, with a repetition rate of 10 Hz, determined by and in synchronism with the laser system. RIS determination of the Fe impurity concentration was typically performed by counting Fe$^+$ photoions for several 50 second intervals.

The laser system for excitation of the resonant, intermediate excited Fe atom level was a tunable dye laser system/Nd:YAG pump laser combination (Molectron, Inc. MY34-DL16). The dye laser was operated with a bandwidth of ~1 cm$^{-1}$ and, after crystal (KDP) frequency doubling, produced output of ~1 mJ in a 15 ns pulse in the 298-305 nm wavelength region. This was more than sufficient to saturate excitation in the $a^5D_J$-$y^5D_J^o$ system of atomic Fe lines. The ionization step used an excimer laser (Lumonics, Inc., 861-T) producing typically 60 mJ in an 8 ns pulse at 308 nm (XeCl operation).

Measurements of the population of the components J=0 to 4 of the $a^5D_J$ Fe ground state were performed to confirm previous data on the distribution of sputtered Fe atoms amongst these levels (which account for virtually all the atoms sputtered). Actual RIS measurements of Fe impurity in samples as a function of depth (depth profiling) employed excitation from the J=4 ground state. Saturation studies were also performed, varying the power from each laser. The dye and excimer laser beams were focused to be ~3 mm diameter in region 76, just in front of the sample.

In the tests as described above with apparatus essentially corresponding to that illustrated in FIG. 2, a sensitivity level of about 80 ppb (atomic %) has been achieved based on iron in silicon samples (limited by background Fe) and an implied statistical limit of ~1 ppb, at a signal/noise ratio of unity, in a 150 counting interval. The laser repetition rate was 10 Hz. The highest surface efficiency was about 1% (Fe atoms detected/Fe atoms sputtered, long bombarding pulse mode [110]), as calibrated via a reference standard.

The foregoing description of embodiments of the invention has been presented for purposes of illustration and description. It is not intended to be exhaustive or to limit the invention to the precise form disclosed, and obviously many modifications and variations are possible in light of the above teaching.

The embodiments of this invention in which an exclusive property or privilege is claimed are defined as follows:

1. A method for the quantitative analysis of a component in a sample comprising the steps of:
   bombarding the sample with a beam of energetic particles or photons to produce ion and neutral atom groups emanating in a direction away from the sample,
   selectively accelerating the ions in the ion group emanating from the sample for separation from the neutral atom group,
   directing one or more laser energy pulses at the neutral atom group to convert the neutral atoms to ions by laser initiated resonance ionization spectroscopy,
   causing the ionized neutral atoms to be selectively deflected with respect to the emanating ions to form a deflected beam of ionized neutral atoms, and
   detecting the ionized neutral atoms in the deflected beam as a measure of the quantity of said component in the sample.

2. The method of claim 1 wherein the step of causing the ionized neutral atoms to be selectively deflected is carried out with a broad band pass and the step of detecting the ionized neutral atoms includes the step of isolating the detection from the ion group emanating from the sample.

3. The method of claim 1 wherein the deflecting step includes the focusing of the deflected beam.

4. The method of claim 2 wherein the deflection of the ionized neutral atoms group causes at least a 90° change in direction of said atoms.

5. The method of claim 1 wherein the bombarding step includes the steps of focusing the energetic particles into a small beam and directing the beam on a surface of the sample substantially perpendicular to the surface.

6. The method of claim 2 wherein the bombarding step is discontinued prior to directing the laser energy pulse at the neutral atom group.

7. The method of claim 6 including the step of photoionizing any neutral atoms of another component emanating from the sample prior to the ionization of said neutral atoms.

8. The method of claim 4 wherein the bombarding step is carried out with a beam of energetic particles and is discontinued prior to directing the laser energy pulse at the neutral atom group.

9. The method of claim 8 including the step of photoionizing any neutral atoms of another component emanating from the sample prior to the ionization of said neutral atoms.

10. The method of claim 9 wherein the bombarding step includes the steps of focusing the energetic particles into a small beam and directing the beam on a surface of the sample substantially perpendicular to the surface and the deflecting step includes the focusing of the deflected beam.

11. The method of claim 2 wherein the step of bombarding the sample is carried out with a beam of energetic photons.

12. The method of claim 8 including the step of sequentially moving the energy beam over a surface of the sample to sequentially provide a plurality of separate ion and neutral groups for analysis.

13. Apparatus for the quantitative analysis of a component in a sample comprising:
   means for bombarding the sample with an energy beam to produce ion and neutral atom groups emanating in a direction away from the sample,
   means for selectively accelerating the ions in the ion group emanating from the sample for separation from the neutral atom group,
   means for directing a laser energy pulse at the neutral atom group to convert the neutral atoms to ions by laser initiated resonance ionization spectroscopy,
   means for causing the ionized neutral atoms to be selectively deflected with respect to the emanating ions to form a deflected beam of ionized neutral atoms, and
   means for detecting the ionized neutral atoms in the deflected beam as a measure of the quantity of said component in the sample.

14. The apparatus of claim 13 wherein the means for causing the ionized neutral atoms to be selectively deflected includes a broad band-pass filter and the means for detecting the ionized neutral atoms includes means for isolating the detection from the ion group emanating from the sample.

15. The apparatus of claim 13 wherein the means includes means for focusing of the deflected beam.

16. The apparatus of claim 14 wherein the means for deflection of the ionized neutral atoms group causes at least a 90° change in direction of said atoms.

17. The apparatus of claim 13 wherein the bombarding means includes means for focusing the energetic particles into a small beam and directing the beam on a surface of the sample substantially perpendicular to the surface.

18. The apparatus of claim 14 wherein the bombarding means is discontinued prior to the action of the means directing the laser energy pulse at the neutral atom group.

19. The apparatus of claim 18 including means for photoionizing any neutral atoms of another component emanating from the sample prior to the ionization of said neutral atoms.

20. The apparatus of claim 16 wherein the bombarding is carried out with a beam of energetic particles and is discontinued prior to the action of means for directing the laser energy pulse at the neutral atom group.

21. The apparatus of claim 20 including means for photoionizing any neutral atoms of another component emanating from the sample prior to the ionization of said neutral atoms.

22. The apparatus of claim 21 wherein the bombarding includes means for focusing the energetic particles into a small beam and directing the beam on a surface of the sample substantially perpendicular to the surface and the deflecting means includes means for focusing of the deflected beam.

23. The apparatus of claim 13 wherein the means for bombarding the sample produces a beam of energetic photons.

24. The apparatus of claim 13 including means for sequentially moving the energy beam over a surface of the sample to sequentially provide a plurality of separate ion and neutral atom groups.

* * * * *